United States Patent
Dumont et al.

(10) Patent No.: US 12,203,811 B2
(45) Date of Patent: Jan. 21, 2025

(54) PROCESS FOR MANUFACTURING A DEVICE FOR DETECTING ELECTROMAGNETIC RADIATION, COMPRISING A GETTER MATERIAL

(71) Applicant: COMMISSARIAT À L'ENERGIE ATOMIQUE ET AUX ENERGIES ALTERNATIVES, Paris (FR)

(72) Inventors: Geoffroy Dumont, Grenoble (FR); Sébastien Becker, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 390 days.

(21) Appl. No.: 17/764,381

(22) PCT Filed: Sep. 28, 2020

(86) PCT No.: PCT/EP2020/077050
§ 371 (c)(1),
(2) Date: Mar. 28, 2022

(87) PCT Pub. No.: WO2021/063861
PCT Pub. Date: Apr. 8, 2021

(65) Prior Publication Data
US 2022/0291044 A1    Sep. 15, 2022

(30) Foreign Application Priority Data

Sep. 30, 2019  (FR) ..................................... 19 10797

(51) Int. Cl.
H01L 33/26    (2010.01)
G01J 5/02    (2022.01)
H10N 15/10    (2023.01)

(52) U.S. Cl.
CPC .............. *G01J 5/024* (2013.01); *H10N 15/10* (2023.02)

(58) Field of Classification Search
CPC .. G01J 5/024; G01J 5/068; G01J 5/045; G01J 5/10; H10N 15/10; B81B 2201/0207;
(Continued)

(56) References Cited

U.S. PATENT DOCUMENTS 9,567,213 B1 *   2/2017  Ehmke ................. B81B 7/0038
11,718,518 B1 *  8/2023  Grosjean .............. B81B 7/0041
                                                       257/415
(Continued)

FOREIGN PATENT DOCUMENTS

CN    106441595 A    2/2017
EP    3 239 670 A1    11/2017

OTHER PUBLICATIONS

International Search Report issued Dec. 18, 2020 in PCT/EP2020/077050 filed Sep. 28, 2020, 2 pages.

*Primary Examiner* — Sheikh Maruf
(74) *Attorney, Agent, or Firm* — Oblon, McClelland, Maier & Neustadt, L.L.P.

(57) ABSTRACT

A process for manufacturing a detection device having at least one thermal detector covered by a mineral sacrificial layer, at least one getter portion covered by a carbon-based sacrificial layer, and a thin encapsulation layer surrounding the thermal detector and the getter portion includes a making a through-opening extending through the mineral sacrificial layer and opening on the substrate. The carbon-based sacrificial layer is deposited so as to cover the getter portion located in the through-opening and to entirely fill the through-opening.

14 Claims, 6 Drawing Sheets

(58) Field of Classification Search
CPC .......... B81B 7/0038; B81C 2201/0109; B81C 2203/0136; B81C 1/00285
USPC .......................................................... 438/55
See application file for complete search history.

(56) References Cited

U.S. PATENT DOCUMENTS

| | | | |
|---|---|---|---|
| 2007/0069133 A1* | 3/2007 | DeWames | G01L 21/12 250/339.02 |
| 2012/0097853 A1* | 4/2012 | Ouvrier-Buffet | G01J 5/068 250/349 |
| 2013/0240738 A1* | 9/2013 | Yon | G01J 5/10 250/349 |
| 2014/0268295 A1* | 9/2014 | Ehmke | B81C 1/00269 359/290 |
| 2015/0123217 A1* | 5/2015 | Reinmuth | G01R 33/0286 257/415 |
| 2015/0137276 A1* | 5/2015 | Cheng | B81B 7/02 438/51 |
| 2016/0023888 A1* | 1/2016 | Quevy | B81C 1/00285 438/48 |
| 2016/0023889 A1* | 1/2016 | Quevy | B81B 3/0021 438/48 |
| 2016/0025664 A1* | 1/2016 | Quevy | B81C 1/00285 438/49 |
| 2016/0043299 A1* | 2/2016 | Fujimori | H10N 30/875 29/25.35 |
| 2016/0161957 A1* | 6/2016 | Lee | G05D 16/2026 700/301 |
| 2016/0355397 A1* | 12/2016 | Quevy | B81C 1/00246 |
| 2016/0362295 A1 | 12/2016 | Quevy et al. | |
| 2017/0113917 A1* | 4/2017 | Yoshikawa | G01L 9/0048 |
| 2017/0152136 A1* | 6/2017 | Ehmke | H01L 24/05 |
| 2017/0197822 A1* | 7/2017 | Quevy | B81B 7/0077 |
| 2017/0317137 A1* | 11/2017 | Yon | G01J 5/20 |
| 2018/0059405 A1* | 3/2018 | Allegato | B81C 1/00523 |
| 2018/0148319 A1* | 5/2018 | Ehmke | B81C 1/00293 |
| 2018/0257929 A1* | 9/2018 | Daneman | B81B 7/0041 |
| 2019/0259779 A1* | 8/2019 | Izumitani | H01L 21/76243 |
| 2020/0147641 A1* | 5/2020 | Fife | B81C 1/00285 |
| 2022/0162063 A1* | 5/2022 | Daneman | B81C 1/00293 |

\* cited by examiner

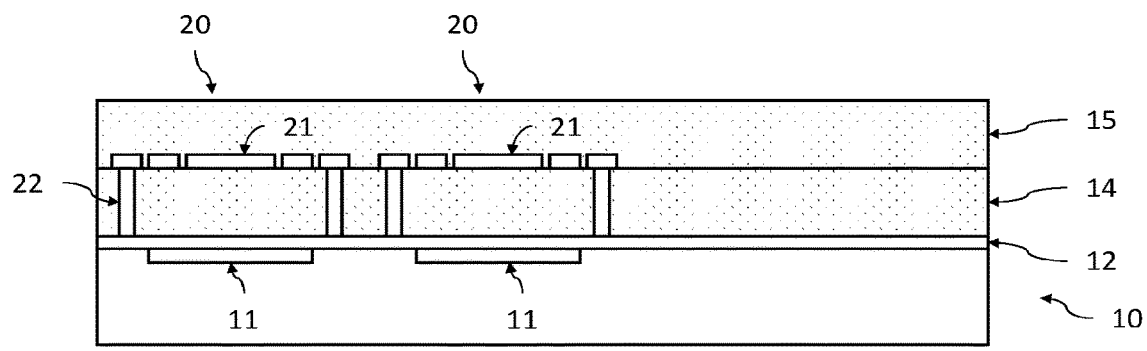
Fig.1A
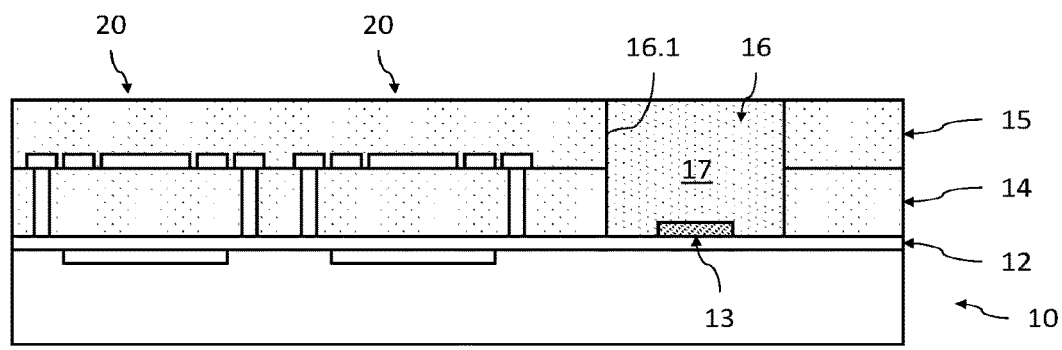
Fig.1B
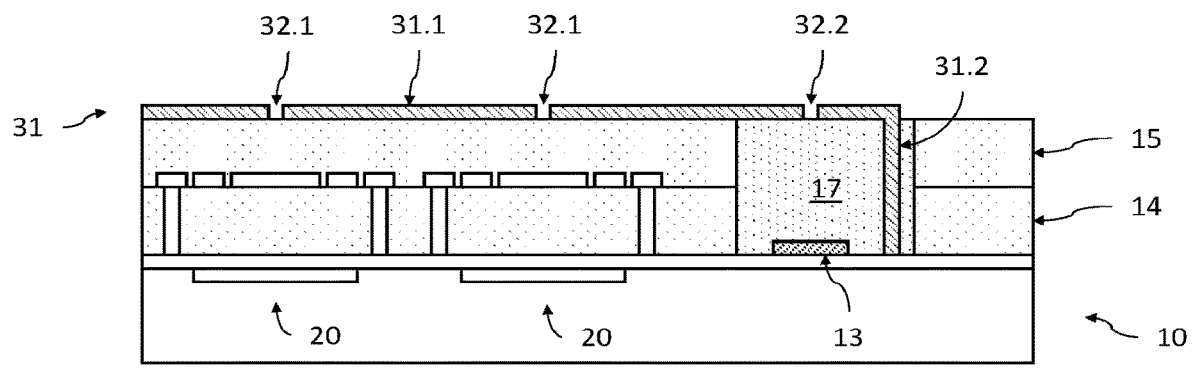
Fig.1C
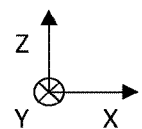

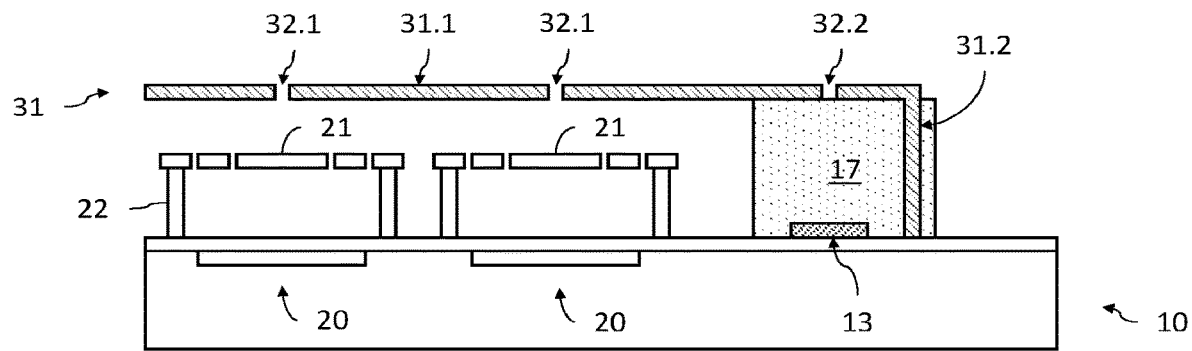
Fig.1D
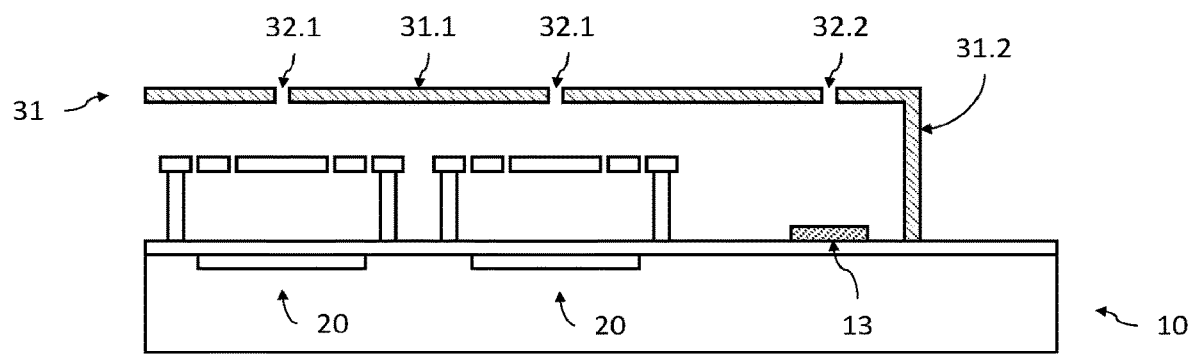
Fig.1E
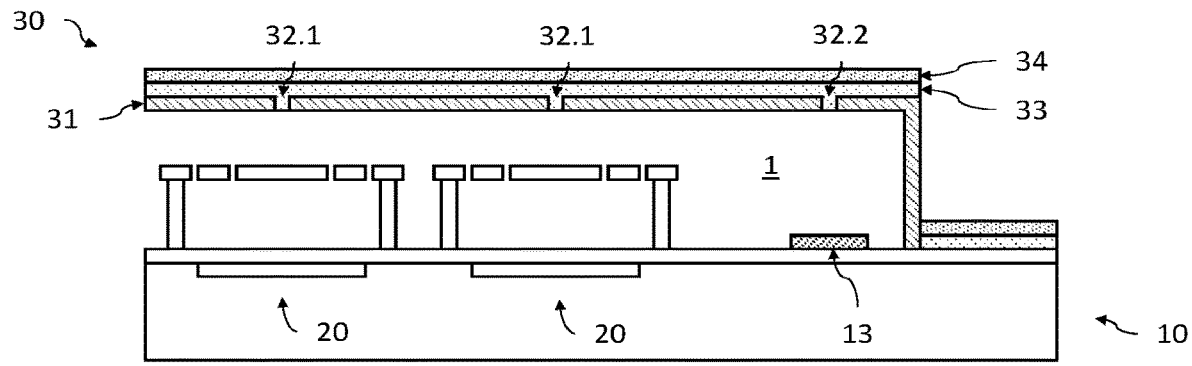
Fig.1F
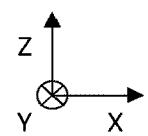

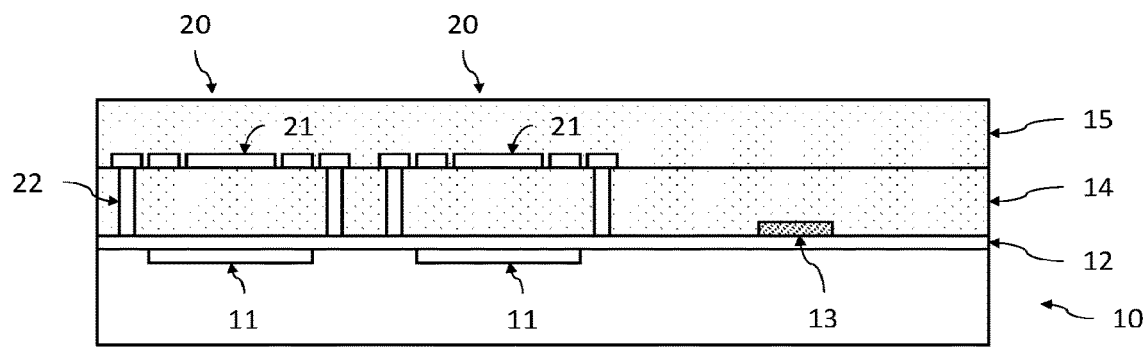
Fig.2A
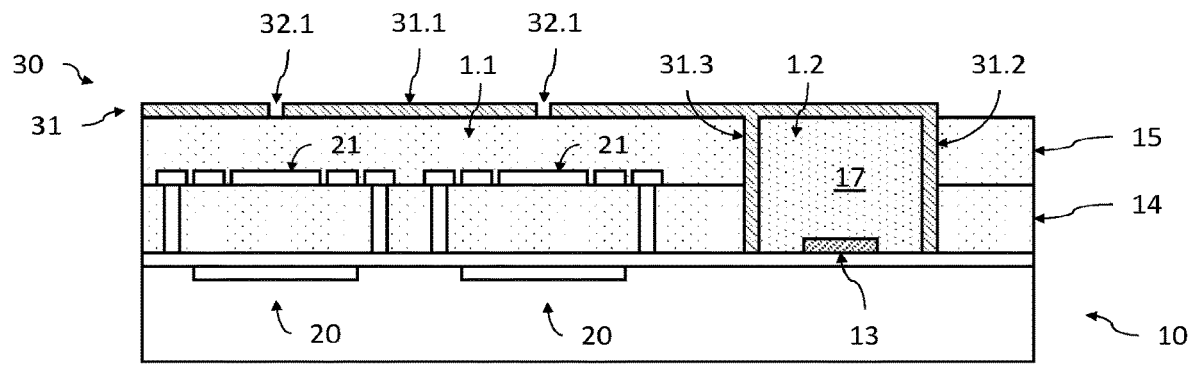
Fig.2B
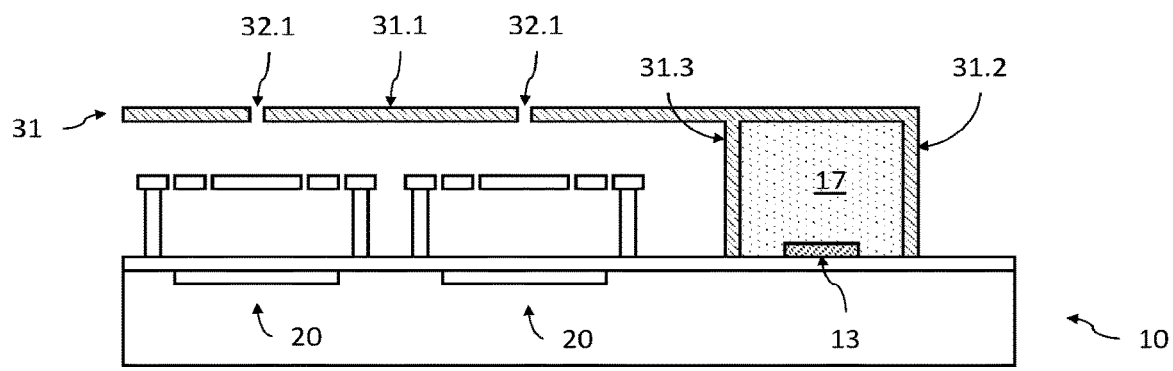
Fig.2C
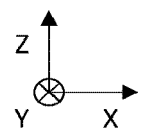

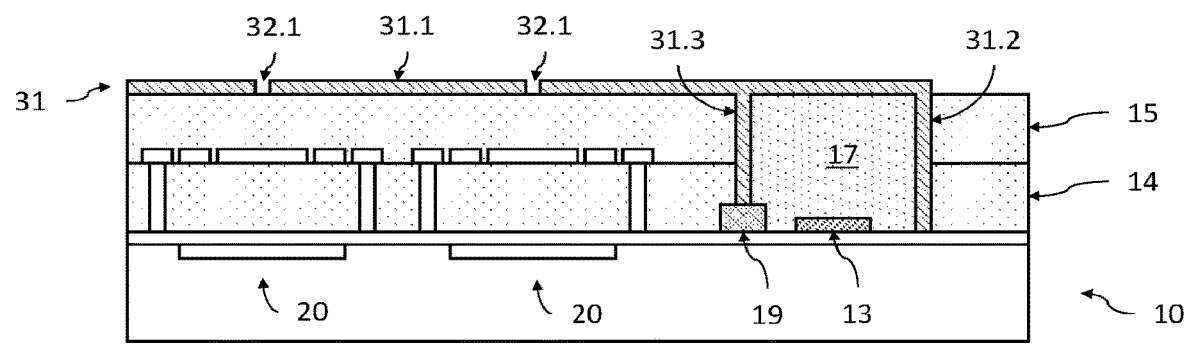
Fig.3A
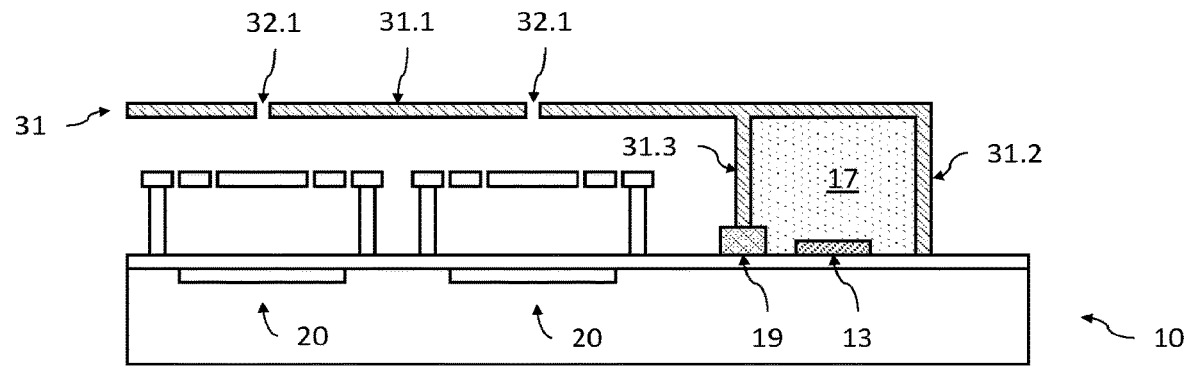
Fig.3B
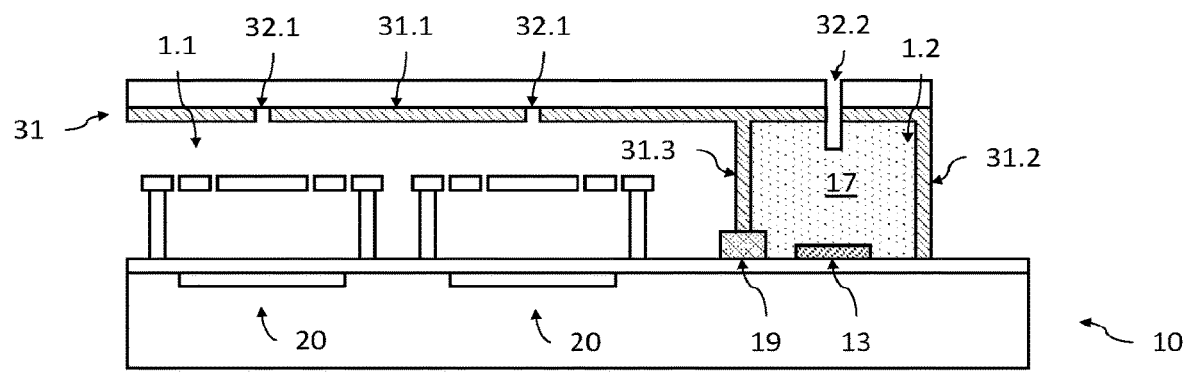
Fig.3C
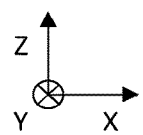

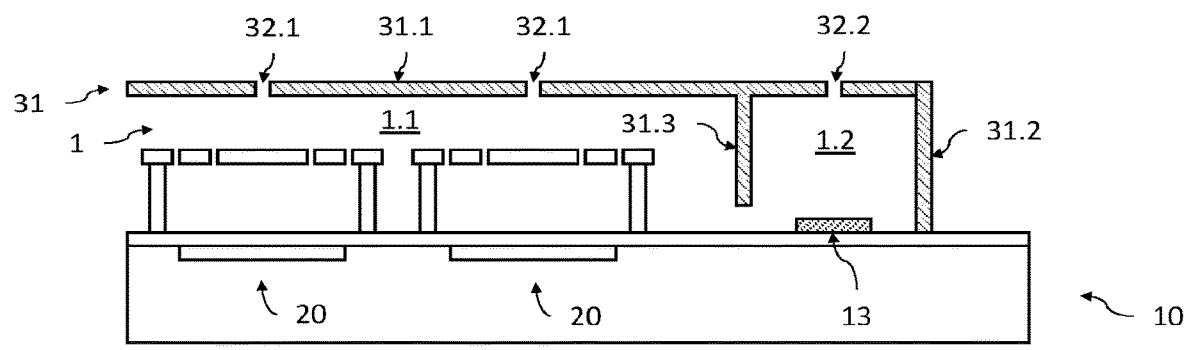
Fig.3D
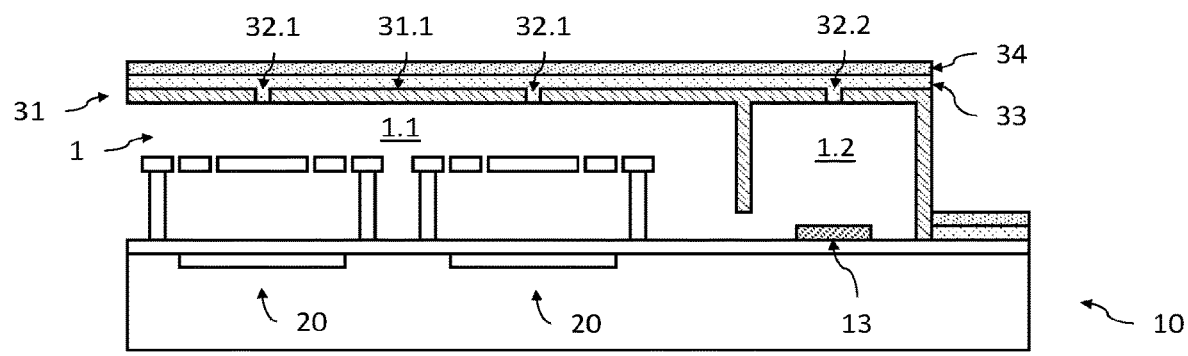
Fig.3E
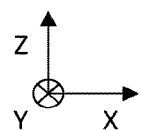

PROCESS FOR MANUFACTURING A DEVICE FOR DETECTING ELECTROMAGNETIC RADIATION, COMPRISING A GETTER MATERIAL

TECHNICAL FIELD

The field of the invention is that of devices for detecting electromagnetic radiation, in particular infrared or terahertz radiation, comprising at least one thermal detector encapsulated in a hermetic cavity, a getter material also being located in the hermetic cavity. The invention is applicable notably to the field of infrared imaging and thermography.

PRIOR ART

A device for detecting electromagnetic radiation, for example infrared or terahertz radiation, may comprise a matrix array of thermal detectors, each comprising an absorbent segment able to absorb the electromagnetic radiation to be detected.

With the aim of ensuring the thermal insulation of the thermal detectors, the absorbent segments usually take the form of membranes that are suspended above the substrate by anchoring pillars, and that are thermally insulated from the substrate by holding arms. These anchoring pillars and holding arms also have an electrical function, electrically connecting the suspended membranes to a readout circuit that is generally located in the substrate.

The readout circuit usually takes the form of a CMOS circuit. It allows a control signal to be applied to the thermal detectors, and detection signals generated by the latter in response to the absorption of the electromagnetic radiation to be detected to be read. The readout circuit comprises various interconnect levels formed by metal lines that are separated from one another by dielectric layers called inter-metal layers. At least one electrical connection pad of the readout circuit is placed on the substrate in such a way that contact may be made thereto from the exterior of the detecting device.

Document EP2581339A1 describes one example of a detecting device the encapsulation structure of which comprises two cavities that communicate with each other, namely a first cavity in which a thermal detector is located, and a second cavity in which a getter material, which pumps gas from the cavities, is located. However, this arrangement of the two cavities defined by the same encapsulation structure leads to the active area of the getter material being particularly small, this possibly leading to a decrease in the performance of the detecting device, and moreover being unsuitable for the case where the same hermetic cavity contains a plurality of thermal detectors.

Document EP3239670A1 describes a process for fabricating a detecting device by means of mineral sacrificial layers that are subsequently removed by a wet chemical etch. A segment of a getter material is located under the absorbent membrane, and is protected from the wet chemical etch by a thin carbon-containing sacrificial layer, which is then removed by a dry chemical etch. The thin carbon-containing sacrificial layer may notably be made of amorphous carbon or of polyimide. However, there is a need, on the one hand, to improve the mechanical strength of the stack obtained at various stages during the fabricating process, and notably during planarization steps, and, on the other hand, to reinforce the protection of the getter material during the removal of the mineral sacrificial layers via the wet chemical etch.

SUMMARY OF THE INVENTION

The objective of the invention is to at least partially remedy the drawbacks of the prior art, and more particularly to provide a process for fabricating a device for detecting electromagnetic radiation, comprising the following steps:

producing, on a substrate, at least one thermal detector, which is covered by at least one mineral sacrificial layer made of a mineral material able to be removed by a first chemical etch;

producing, on the substrate, a getter segment made of a metal that has a gettering effect, which getter segment is covered by a carbon-containing sacrificial layer made of a carbon-containing material that is inert to the first chemical etch and that is able to be removed by a second chemical etch;

producing a thin encapsulation layer comprising a top portion that rests on the mineral sacrificial layer and on the carbon-containing sacrificial layer, and a peripheral portion that extends through the mineral sacrificial layer and that surrounds the thermal detector and the getter segment;

removing the mineral sacrificial layer via the first chemical etch; and removing the carbon-containing sacrificial layer via the second chemical etch.

According to the invention, the getter segment is placed in contact with the substrate at a distance from the thermal detector in a plane parallel to the substrate.

In addition, the step of producing the carbon-containing sacrificial layer is carried out after the step of producing the thermal detector, and comprises:

producing a through-aperture that extends through the mineral sacrificial layer and that opens onto the substrate. The getter segment is located in the through-aperture, at a distance from a lateral border that is defined by the mineral sacrificial layer and that bounds the through-aperture in the plane parallel to the substrate. In other words, the getter segment does not make contact with the mineral sacrificial layer that surrounds it.

depositing the carbon-containing sacrificial layer so as to cover the getter segment located in the through-aperture and to surround it in the plane parallel to the substrate, and to completely fill the through-aperture. In other words, the mineral sacrificial layer covers and makes contact with the free faces of the getter segment in the plane parallel to the substrate and along an axis orthogonal to the substrate.

The getter segment rests on the substrate, and is encapsulated by the carbon-containing sacrificial layer.

Lastly, the top portion of the thin encapsulation layer rests on the mineral sacrificial layer and on the carbon-containing sacrificial layer.

The following are certain preferred but non-limiting aspects of this process.

The getter segment may be placed between the thermal detector and the peripheral portion of the thin encapsulation layer.

The peripheral portion may comprise an internal surface, which is oriented toward the thermal detector, and which makes contact with the carbon-containing sacrificial layer.

The mineral sacrificial layer and the carbon-containing sacrificial layer may have, opposite the substrate, top faces that are coplanar.

The mineral material may comprise at least silicon oxide or silicon nitride, and the first chemical etch may be an etch in hydrofluoric-acid vapor.

The carbon-containing material may be chosen from amorphous carbon and polyimide, and the second chemical etch may be a dry oxygen-plasma etch.

The metal that has a gettering effect may be chosen from titanium, zirconium, vanadium, chromium, cobalt, iron, manganese, palladium, barium, and/or aluminum, and an alloy of these metals.

The process may comprise producing at least one first release vent and at least one second release vent through the top portion of the thin encapsulation layer, the first release vent opening onto the mineral sacrificial layer, and the second release vent opening onto the carbon-containing sacrificial layer.

The first and second release vents may be produced before the first chemical etch, the carbon-containing sacrificial layer under the top portion of the thin encapsulation layer making contact with the mineral sacrificial layer.

The thin encapsulation layer may further comprise an internal portion that extends from the top portion toward the substrate, and that is placed between the mineral sacrificial layer and the carbon-containing sacrificial layer, so that the carbon-containing sacrificial layer under the top portion of the thin encapsulation layer makes contact with the top portion, peripheral portion and internal portion of the thin encapsulation layer.

The step of producing the second release vents may comprise, in addition to forming at least one second release vent that opens onto the carbon-containing sacrificial layer, forming at least one vent located plumb with the internal portion and that breaks the physical link, at least locally, between the internal wall and the top portion, thus ensuring, after the second chemical etch, communication between a first space in which the thermal detector is located and a second space in which the getter segment is located.

The internal portion may rest in contact with a carbon-containing segment placed in contact with the substrate and be made of a carbon-containing material that is inert to the first chemical etch and that is able to be removed by the second chemical etch, so that the second chemical etch removes the carbon-containing sacrificial layer and releases the getter segment, and removes the carbon-containing segment and ensures communication between a first space in which the thermal detector is located and a second space in which the getter segment is located.

A plurality of thermal detectors may be produced simultaneously, and each comprise a membrane configured to absorb the electromagnetic radiation to be detected, said membrane being suspended above the substrate by anchoring pillars and being thermally insulated from the substrate by holding arms.

Moreover, the top portion of the thin encapsulation layer may rest on and in contact with the mineral sacrificial layer, and may rest on and in contact with the carbon-containing sacrificial layer.

BRIEF DESCRIPTION OF THE DRAWINGS

Other aspects, aims, advantages and features of the invention will become more clearly apparent on reading the following detailed description of preferred embodiments thereof, this description being given by way of non-limiting example and with reference to the appended drawings, in which:

FIGS. 1A to 1F are schematic and partial views, in cross section, of various steps of a process for fabricating a detecting device according to a first embodiment;

FIGS. 2A to 2F are schematic and partial views, in cross section, of various steps of a process for fabricating a detecting device according to a second embodiment; and FIGS. 3A to 3E are schematic and partial views, in cross section, of various steps of a process for fabricating a detecting device according to a variant of the second embodiment.

DETAILED DESCRIPTION OF PARTICULAR EMBODIMENTS

Figure 2D:
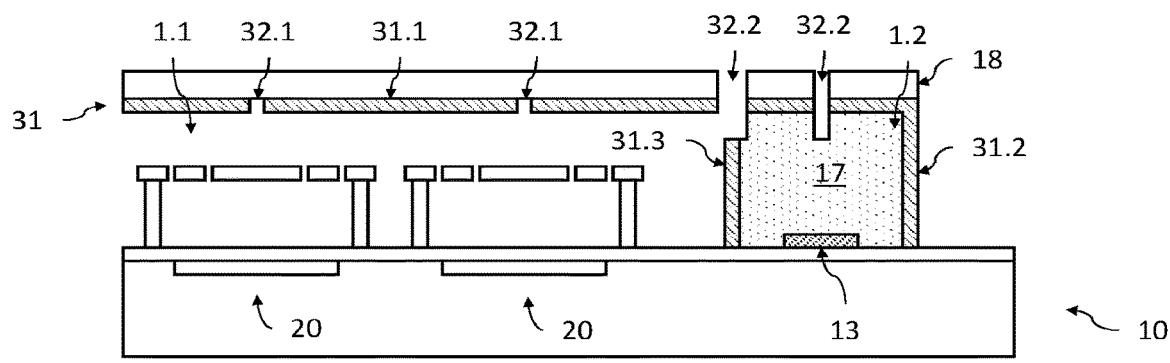

In the figures and in the remainder of the description, the same references have been used to designate identical or similar elements. In addition, the various elements are not shown to scale so as to improve the clarity of the figures. Moreover, the various embodiments and variants are not mutually exclusive and may be combined with one another. Unless otherwise indicated, the terms "substantially", "about" and "of the order of" mean to within 10%, and preferably to within 5%. Moreover, the terms "comprised between . . . and . . . " and equivalents mean that the bounds are included, unless indicated otherwise.

The invention applies to a process for fabricating a device for detecting electromagnetic radiation that is suitable for detecting infrared or terahertz radiation. It comprises at least one thermal detector intended to be located in a hermetic cavity, and a material that has a gettering effect, which rests on the substrate inside the hermetic cavity. This material that has a gettering effect is a material that is exposed to the atmosphere of the hermetic cavity and that is able to pump gas via absorption and/or adsorption. It is a metal that may be chosen from titanium, zirconium, vanadium, chromium, cobalt, iron, manganese, palladium, barium and/or aluminum, or even an alloy of these metals such as TiZrV.

The fabricating process comprises a step of producing the thermal detector by means of at least one sacrificial layer that is said to be mineral. This mineral sacrificial layer is made of a mineral or inorganic material. It is here a silicon-based dielectric that also allows an inter-metal dielectric layer of the readout circuit to be formed, i.e. an electrically insulating material that, for example, has a dielectric constant, or relative permittivity, lower than or equal to 3.9, allowing the parasitic capacitance between interconnects to be limited. This mineral material does not comprise any carbon-containing chains, and may be a silicon oxide $SiO_x$ or a silicon nitride $Si_xN_y$, or an organosilicon material such as SiOC and SiOCH, or a material of the fluoride glass type such as SiOF. The mineral sacrificial layer may be removed via a wet chemical etch such as a chemical etch in an acid medium, hydrofluoric-acid vapor (HF vapor) for example. By "wet etch" what is generally meant is that the etchant is a liquid or vapor, and here, preferably, a vapor.

The fabricating process also comprises a step for producing a sacrificial layer that is said to be carbon-containing, and that is able to protect the getter material in the step of wet chemical etching, such as an etch in HF vapor, carried out to remove the mineral sacrificial layer. This carbon-containing sacrificial layer comprises a carbon-containing material, i.e. a material formed from at least one type of chemical species comprising carbon atoms. Thus it may be a mineral material such as amorphous carbon, optionally of the DLC type (DLC being the acronym of diamond-like carbon), or an organic material such as polyimide. Carbon of DLC type is amorphous carbon with a high degree of carbon spa hybridization. Preferably, the carbon-containing material does not comprise any silicon, thereby avoiding the presence of any residues after the step of removing this sacrificial layer. The carbon-containing sacrificial layer is thus substantially inert with respect to the wet chemical etch carried out to remove the mineral sacrificial layer. By "substantially inert" what is meant is that the carbon-containing material hardly reacts at all with the etchant used in the step of removing the mineral sacrificial layer, or even reacts only slightly, so that the carbon-containing sacrificial layer, at the end of this removing step, still entirely covers the getter material. The carbon-containing sacrificial layer may furthermore be removed via a chemical etch such as a dry chemical etch an etchant of which is, for example, oxygen contained in a plasma.

FIGS. 1A to 1F illustrate various steps of a process for fabricating a detecting device according to a first embodiment. Only one portion of the detecting device has been shown. By way of example, the thermal detectors 20 are here configured to detect infrared radiation in the LWIR range (LWIR being the acronym of long-wavelength infrared), the wavelength of which is comprised between about 8 µm and 14 µm. The detecting device comprises one or more thermal detectors 20 located in the same hermetic cavity 1, and preferably here a matrix array of identical thermal detectors 20 that are connected to a readout circuit located in the substrate 10 (which is thus called the readout substrate). Thus the thermal detectors 20 form sensitive pixels that are periodically arranged, and that may have a lateral dimension in the plane of the readout substrate 10 of the order of a few tens of microns, and for example equal to about 10 µm or even less.

Here, a three-dimensional direct coordinate system XYZ is defined in which the XY-plane is substantially parallel to the plane of the readout substrate 10, the Z-axis being oriented toward the thermal detectors 20 in a direction that is substantially orthogonal to the plane of the readout substrate 10; reference will be made to this coordinate system in the rest of the description. The terms "vertical" and "vertically" are to be understood as being relative to an orientation substantially parallel to the Z-axis, and the terms "horizontal" and "horizontally" are to be understood as being relative to an orientation substantially parallel to the (X,Y)-plane. Moreover, the terms "bottom" and "top" are to be understood as being relative to positions of increasing distance from the readout substrate 10 in the +Z-direction.

With reference to FIG. 1A, a matrix array of thermal detectors 20 is produced on the readout substrate 10, such that they are covered by a sacrificial mineral layer 15.

The readout substrate 10 is silicon-based, and is formed from a carrier substrate containing the readout circuit (not shown), which is configured to control and read the thermal detectors 20. The readout circuit here takes the form of a CMOS integrated circuit. It comprises, inter alia, segments of conductive lines separated from one another by inter-metal insulating layers made of a dielectric, for example a silicon-based mineral material such as silicon oxide $SiO_x$ or silicon nitride $SiN_x$, inter alia.

The readout substrate 10 may comprise a reflector 11 placed facing each thermal detector 20. The reflector 11 may be formed by a segment of a conductive line of the last interconnect level, this line being made of a material able to reflect the electromagnetic radiation to be detected. It lies facing the absorbent membrane 21 of the thermal detector 20, and is intended to form therewith a quarter-wave interference cavity with respect to the electromagnetic radiation to be detected.

Lastly, the readout substrate 10 here comprises a protective layer 12 so as notably to cover the top inter-metal insulating layer. This protective layer 12 here corresponds to an etch-stop layer made of a material that is substantially inert to the chemical etchant used subsequently to remove the mineral sacrificial layers 14, 15, to HF vapor for example. This protective layer 12 thus forms a hermetic and chemically inert layer that is electrically insulating in order to prevent any short-circuit between the anchoring pillars 22. Thus it allows etching of the underlying inter-metal insulating layers to be avoided in this step of removing the mineral sacrificial layers 14, 15. It may be formed from an aluminum oxide or nitride, from aluminum trifluoride, or from unintentionally doped amorphous silicon.

The thermal detectors 20 are then produced on the readout substrate 10. These production steps are identical or similar to those described, notably, in document EP3239670A1. The thermal detectors 20 are here microbolometers that each comprise an absorbent membrane 21, i.e. a membrane able to absorb the electromagnetic radiation to be detected, that is suspended above the readout substrate 10 by anchoring pillars 22, and that is thermally insulated from the readout substrate by holding arms. The absorbent membranes 21 are conventionally obtained using surface micro-machining techniques that consist in producing anchoring pillars 22 through a first mineral sacrificial layer 14, and the thermally insulating arms and the absorbent membranes 21 on the top face of the first sacrificial layer. Each absorbent membrane 21 furthermore comprises a thermometric transducer, for example a thermistor material, that is connected to the readout circuit by electrical connections provided in the thermally insulating arms and in the anchoring pillars 22. Next, a second mineral sacrificial layer 15, which is preferably of the same nature as the first mineral sacrificial layer 14, is deposited. The mineral sacrificial layer 15 covers the mineral sacrificial layer 14 and the thermal detectors 20.

With reference to FIG. 1B, a carbon-containing sacrificial layer 17 is produced that covers a getter material resting on the readout substrate 10, and here in contact with the latter.

To do this, a through-aperture 16 that extends through the mineral sacrificial layers 14, 15 to open onto the readout substrate 10 is produced by photolithography and etching. Preferably, this through-aperture 16 does not open onto any portion of either of the thermal detectors 20. Thus, the thermal detectors 20 remain entirely covered by the mineral sacrificial layers 14, 15. The through-aperture 16 is bounded in the XY-plane by a lateral border 16.1 that is defined by the mineral sacrificial layers 14, 15. It has lateral dimensions larger than those of the desired getter segment 13. By way of example, for a getter segment 13 with a width of the order of a few tens to a few hundred microns, or even millimeters, and for example equal to about 100 µm, the through-aperture 16 may have a width of the order from a few tens to a few hundred microns, and for example equal to about 150 µm. Thus, the distance in the XY-plane between the getter segment 13 and the lateral border 16.1 of the through-aperture defines the dimension of protection of the getter segment 13 by the carbon-containing sacrificial layer 17 during the HF-vapor etch. Insofar as the carbon-containing sacrificial layer 17 is not a thin layer the dimension of protection of which is of the order of about 0.5 µm as in document EP3239670A1, the dimension of protection may here be of the order of a few tens or even of a few hundred microns.

A getter segment 13 is then produced, this getter segment being located in the through-aperture 16 and resting on the readout substrate 10, here in contact with the latter. To do this, a thin layer of getter material is deposited, such that it lies in contact with the readout substrate 10. The thin layer of getter material may also extend over the top face of the mineral sacrificial layer 15, and over the lateral border 16.1 of the through-aperture 16. The portions of the thin getter layer that are located on the top face of the sacrificial mineral layer 15 and on the lateral border 16.1 of the through-aperture 16 are then removed, for example by localized etching. A peripheral zone of the thin getter layer that rests on the readout substrate 10 and that makes contact with the lateral border 16.1 is also removed, so as to keep only a central portion. The latter therefore rests on the readout substrate 10 and is located at a non-zero distance from the mineral sacrificial layers 14, 15 in the XY-plane. In other words, the getter segment 13 is placed offset in the XY-plane with respect to the thermal detectors 20, and is not located facing (i.e. plumb with) them along the Z-axis as in EP3239670A1, neither wholly nor in part. The getter segment 13 is therefore located at a distance in the XY-plane, and therefore at a non-zero distance in the XY-plane, from the thermal detectors 20, i.e. from the absorbent membrane and anchoring pillars.

The through-aperture 16 is then completely filled with a carbon-containing sacrificial layer 17 that completely covers the getter segment 13. This layer is said to be thick insofar as its thickness allows the through-aperture 16 to be completely filled. It may thus be made of polyimide or of amorphous carbon, and here is made of polyimide. Thus, the carbon-containing sacrificial layer 17 covers the getter segment 13 along the Z-axis, and completely surrounds it in the XY-plane. The carbon-containing sacrificial layer 17 will therefore be able to ensure the protection of the getter segment 13 during a chemical etch, for example in HF-acid vapor, carried out subsequently to remove the sacrificial mineral layers 14, 15. The dimension of protection in the XY-plane may thus be of the order of a few tens to a few hundred microns. The portion of the carbon-containing sacrificial layer 17 that covers the sacrificial mineral layer 15 is then removed, so as to obtain a planar top face defined by the sacrificial mineral layer 15 and by the carbon-containing sacrificial layer 17.

With reference to FIG. 1C, the thin encapsulation layer 31 of the encapsulation structure 30 is then produced in a manner similar to that described in document EP3239670A1. The various thin layers of the encapsulation structure 30 are transparent to the electromagnetic radiation to be detected. Using conventional photolithography techniques, the mineral sacrificial layers 14 and 15 are then etched locally until the readout substrate 10, or even a surface of the getter segment 13, is uncovered. Be that as it may, the etched zones here take the form of continuous and closed perimeter trenches surrounding the thermal detectors 20 and at least partially the getter segment 13.

Conformal deposition of the thin encapsulation layer 31, which here is of amorphous silicon, is then carried out, for example using chemical vapor deposition (CVD), this thin encapsulation layer extending over the mineral sacrificial layer 15 and over the carbon-containing sacrificial layer 17 and into the trenches. The thin encapsulation layer 31 comprises a top portion 31.1 (also called the top wall) that lies above and at a distance from the thermal detectors 20 and from the getter segment 13, and a peripheral portion 31.2 (also called the peripheral wall) that continuously surrounds in the XY-plane the thermal detectors 20 and the getter segment 13, and that will subsequently bound the hermetic cavity 1 in the XY-plane. The top wall 31.1 therefore rests on and in contact with the mineral sacrificial layer 15 and with the carbon-containing sacrificial layer 17. The peripheral wall 31.2 is placed so as preferably to have its internal surface oriented toward the thermal detectors 20 in contact with the carbon-containing sacrificial layer 17.

Through-holes 32.1, 32.2 forming release vents that are intended to allow the various sacrificial layers to be evacuated from the cavity are then produced, by photolithography and etching, in the thin encapsulation layer 31. First vents 32.1 are located facing, along the Z-axis, the mineral sacrificial layers 14, 15, and are placed, for example, above the absorbent membranes 21, and, preferably, at least one second vent 32.2 is located facing, along the Z-axis, the carbon-containing sacrificial layer 17.

With reference to FIG. 1D, a first chemical etch suitable for removing the two mineral sacrificial layers 14, 15 is carried out, here via a wet chemical etch in hydrofluoric-acid vapor. The products of the chemical reaction are evacuated through the first release vents 32.1. Since this wet chemical etch is isotropic, suspension of the absorbent membrane 21 is obtained, and the anchoring pillars 22 are released. The first chemical etch is selective so that the carbon-containing sacrificial layer 17 is not removed, the getter segment 13 thus being entirely protected from the HF-vapor etch. Thus, the carbon-containing sacrificial layer 17 is released, i.e. the surface thereof initially in contact with the mineral sacrificial layers 14, 15 is now free. It covers the getter segment 13 and completely surrounds it in the XY-plane. The top wall 31.1 of the thin encapsulation layer 31 therefore partially rests on the carbon-containing sacrificial layer 17.

With reference to FIG. 1E, a second chemical etch suitable for removing the carbon-containing sacrificial layer 17 and therefore releasing the getter segment 13 is carried out. The chemical etch is here a dry chemical etch the etchant of which is here oxygen present in a plasma. Since this dry chemical etch is isotropic, the integrity of the released structures is preserved while facilitating the etchant's access to the cavity through the release vents 32.1, 32.2. Thus, the getter segment 13 is released, i.e. it has a free (uncoated) surface, and is therefore exposed to the atmosphere of the cavity.

With reference to FIG. 1F, a sealing layer 33 is deposited on the thin encapsulation layer 31 with a sufficient thickness to ensure the various release vents 32.1, 32.2 are sealed, i.e. plugged. The sealing layer 33 is transparent to the electromagnetic radiation to be detected, and may be made of germanium with a thickness of about 1.7 µm. An antireflection layer 34 that allows the transmission of the electromagnetic radiation through the encapsulation structure 30 to be optimized is then deposited. This antireflection layer 34 may be made of zinc sulfide with a thickness of about 1.2 µm. A hermetic cavity 1 that is under vacuum or at a low pressure, and in which the thermal detectors 20 and the getter segment 13 are housed, is thus obtained.

The chemisorption of the getter segment 13 is then activated by subjecting the detecting device to a suitable heat treatment in an oven, so as to make the getter material react with residual gas molecules present in the hermetic cavity 1 and thus form stable chemical compounds. A sustained or decreased vacuum level is thus obtained inside the hermetic cavity 1, thus extending the lifetime of the detecting device.

Thus, the fabricating process allows a detecting device to be obtained that comprises one or more thermal detectors 20 and a getter segment 13 that are all located in one hermetic cavity 1. The getter segment 13 is located at a distance in the XY-plane from the thermal detectors, i.e. is located offset (at a non-zero distance) in the XY-plane with respect to the thermal detectors 20, and preferably is located between the thermal detectors 20 and the peripheral wall 31.2 of the thin encapsulation layer 31. It is protected with respect to the first chemical etch by a thick carbon-containing sacrificial layer, which, in addition to the mineral sacrificial layers 14, 15, participates in supporting the thin encapsulation layer 31 along the Z-axis.

The mineral sacrificial layers 14, 15 remain mechanically in place during the CMP steps carried out successively to planarize the top face of the various deposited mineral sacrificial layers 14, 15. This avoids the mechanical fragility mentioned in document EP3239670A1 and observed for a configuration in which a getter segment 13 is located under a thermal detector 20 and is protected by a thin carbon-containing sacrificial layer made of polyimide. Specifically, in the context of the invention, the mineral sacrificial layers 14, 15 do not rest on the carbon-containing sacrificial layer 17, which is located in a through-aperture 16 extending through the mineral sacrificial layers 14, 15.

In addition, the integrity of the getter segment 13 is also preserved insofar as the getter segment 13 is protected by a thick carbon-containing sacrificial layer and not by a thin carbon-containing sacrificial layer, so that the dimension of protection may be substantially larger. In the context of the invention, the carbon-containing sacrificial layer 17 is a thick layer (and not a thin layer) that completely surrounds the getter segment 13 in the XY-plane. It may be made of polyimide or of amorphous carbon. The dimension of protection may be of the order of a few tens or even of a few hundred microns, this greatly improving the protection of the getter segment 13. Advantage is taken thereof to ensure a portion of the support of the thin encapsulation layer 31 during the deposition thereof. Moreover, the getter segment 13 is not located facing the absorbent membranes 21 as is the case in document EP3239670A1, this permitting the area of the getter material used to be increased. In addition, the getter material may be chosen solely depending on its chemisorption properties, and not depending on a supplementary property of optical reflection. A getter material having a high chemisorption performance may therefore be chosen.

FIGS. 2A to 2F illustrate various steps of a process for fabricating a detecting device according to a second embodiment. Only one portion of the detecting device has been shown. This embodiment differs from that described above essentially in that the thin encapsulation layer 31 comprises an internal portion 31.3 (also called the internal wall) that is located between the mineral sacrificial layers 14, 15 and the carbon-containing sacrificial layer 17, and that physically protects the carbon-containing sacrificial layer 17 with respect to the first chemical etch.

With reference to FIG. 2A, the matrix array of thermal detectors 20 is produced on the readout substrate 10, such that they are covered by a mineral sacrificial layer 15. This step is similar to that described with reference to FIG. 1A, and here differs therefrom in that the getter segment 13 is produced on the protective layer 12 before the deposition of the mineral sacrificial layer 14 and the production of the absorbent membranes 21. The getter segment 13 is thus located offset in the XY-plane with respect to the thermal detectors 20, and is covered by the two mineral sacrificial layers 14, 15. It will however be noted that the getter segment 13 may here also be produced after the absorbent membranes 21 have been produced and the sacrificial layer 15 deposited.

With reference to FIG. 2B, the thin encapsulation layer 31 of the encapsulation structure 30 is then produced in a manner similar to that described with reference to FIG. 1B. However, an internal wall 31.3 extends in the XY-plane so as to separate the carbon-containing sacrificial layer 17 from the mineral sacrificial layers 14, 15. It thus has a face that makes contact with the mineral sacrificial layers 14, 15, and an opposite face that makes contact with the carbon-containing sacrificial layer 17. It rests in contact with the readout substrate 10 and joins along the Z-axis the top wall 31.1 of the thin encapsulation layer 31. Thus, the internal wall 31.3 bounds, with the peripheral wall 31.2, a hermetic space 1.2 that is separate from the space 1.1 in which the thermal detectors 20 are located.

Through-holes 32.1, forming first release vents intended to allow the mineral sacrificial layers 14, 15 to be evacuated from the cavity, are then produced by photolithography and etching in the thin encapsulation layer 31. These first vents 32.1 are located facing, along the Z-axis, the mineral sacrificial layers 14, 15, and for example above the absorbent membranes 21. Preferably, no second vent 32.2 opening onto the carbon-containing sacrificial layer 17 is produced at this stage.

With reference to FIG. 2C, the first chemical etch is carried out to remove the two mineral sacrificial layers 14, 15, here using a wet chemical etch in HF vapor. The products of the chemical reaction are evacuated through the first release vents 32.1. Thus, unlike the first embodiment, the carbon-containing sacrificial layer 17 is completely preserved via the physical protection provided by the internal wall 31.3. In the case where the wet chemical etch leads to partial etching of the carbon-containing sacrificial layer 17, the latter is here entirely preserved.

With reference to FIG. 2D, the one or more second release vents 32.2 intended to allow the carbon-containing sacrificial layer 17 to be evacuated from the space 1.2 in which the carbon-containing sacrificial layer 17 is located are then produced. These second vents 32.2 are located facing, along the Z-axis, the carbon-containing sacrificial layer 17. At least one second vent 32.2 is located plumb with the internal wall 31.3, so as to break, continuously or locally, the physical link of the latter with the top wall 31.1. This step is performed by photolithography and etching using a photoresist 18 that is then removed. This photoresist 18 has viscosity properties such that it does not penetrate into the vents 32.1.

Figure 2E:
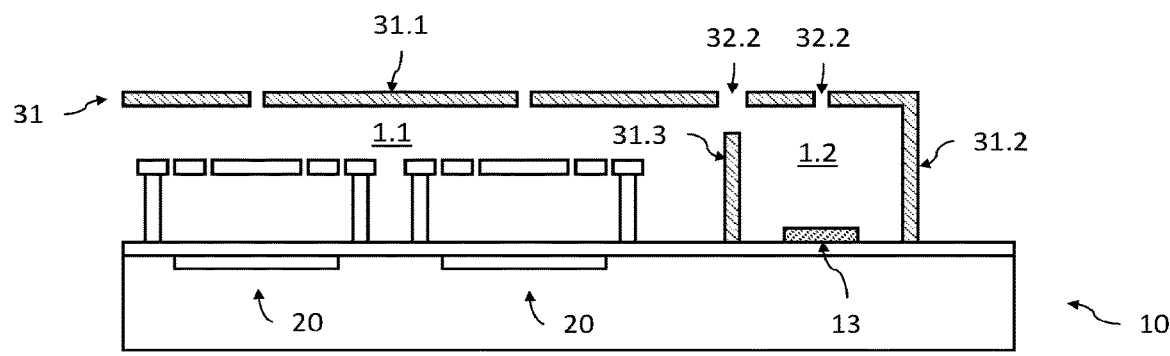

With reference to FIG. 2E, the second chemical etch suitable for removing the carbon-containing sacrificial layer 17 and releasing the getter segment 13 is carried out. The chemical etch is here a dry chemical etch the etchant of which is here oxygen present in a plasma. The etch products given off by the carbon-containing sacrificial layer 17 for the most part escape through the second vents 32.2. Communication is thus ensured between the space 1.1 in which the thermal detectors 20 are located and the space 1.2 in which the getter segment 13 is located.

Figure 2F:
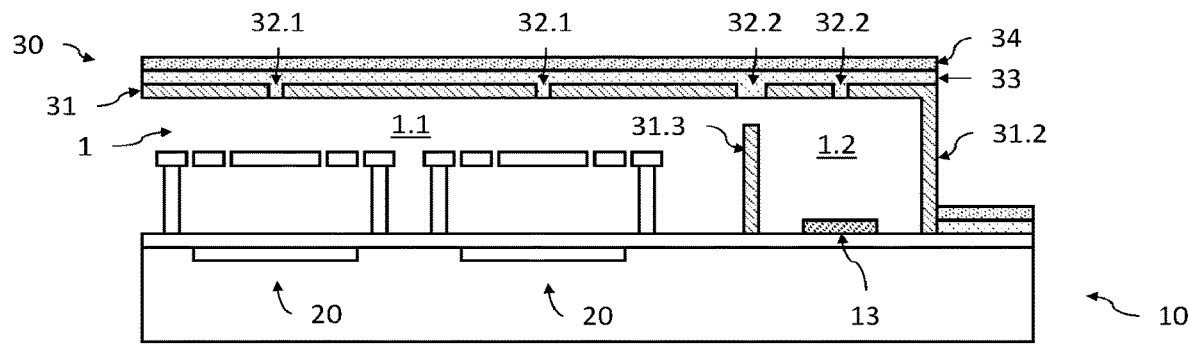

With reference to FIG. 2F, the sealing layer 33 is then deposited on the thin encapsulation layer 31 so as to seal, i.e. plug, the various release vents 32.1, 32.2. Furthermore, the antireflection layer 34 is deposited. The chemisorption of the getter segment 13 is then activated via a heat treatment.

Thus, by producing a hermetic space 1.2, which is notably formed by the internal wall 31.3 of the thin encapsulation layer 31, and in which the carbon-containing sacrificial layer 17 and therefore the getter segment 13 is located, the carbon-containing sacrificial layer 17 is not degraded by the wet chemical etch, here the HF-vapor etch, and the protection of the getter segment 13 with respect to this etch is further improved. This embodiment is particularly advantageous when the carbon-containing sacrificial layer 17 may react slightly with the etchant employed in the first chemical etch.

FIGS. 3A to 3E illustrate various steps of a process for fabricating a detecting device according to a variant of the second embodiment. Only one portion of the detecting device has been shown. This variant differs from the second embodiment in the means used to ensure the communication between the space 1.1 in which the thermal detectors 20 are located and the space 1.2 in which the carbon-containing sacrificial layer 17 and the getter segment 13 are located.

With reference to FIG. 3A, a segment of another carbon-containing sacrificial layer 17, called a carbon-containing segment 19, is produced beforehand on and in contact with the readout substrate 10 between the thermal detectors 20 and the getter segment 13. This carbon-containing segment 19 is made of a carbon-containing material that is substantially inert to the first chemical etch, here to the HF-vapor etch, and that is able to be removed by the second chemical etch, here the $O_2$ plasma. It may be made of the same material as the carbon-containing sacrificial layer 17, or of a different material. In this example, the carbon-containing segment 19 is made of amorphous carbon, and the carbon-containing sacrificial layer 17 is made of polyimide. The thin encapsulation layer 31 comprises an internal wall 31.3 that is similar to that described in the second embodiment, with the exception that it rests in contact with the carbon-containing segment 19, and joins the top wall 31.1 along the Z-axis.

With reference to FIG. 3B, the first chemical etch is carried out to remove the two mineral sacrificial layers 14, 15, here using a wet chemical etch in HF vapor. The products of the chemical reaction are evacuated through the first release vents 32.1. Insofar as the carbon-containing segment 19 is inert with respect to the HF-vapor etch, there is no breakage of the physical link between the internal wall 31.3 and the readout substrate 10. Thus, the carbon-containing sacrificial layer 17 remains completely preserved.

With reference to FIG. 3C, the one or more second release vents 32.2 intended to allow the carbon-containing sacrificial layer 17 to be evacuated from the space 1.2 in which the carbon-containing sacrificial layer 17 is located are then produced. These second vents 32.2 are located facing, along the Z-axis, the carbon-containing sacrificial layer 17. However, unlike FIG. 2D, a vent is not produced plumb with the internal wall 31.3 so as to break the physical link thereof with the top wall 31.1. The physical link will be broken by removing the carbon-containing segment 19.

With reference to FIG. 3D, the second chemical etch is carried out to remove the carbon-containing sacrificial layer 17 and to release the getter segment 13, but also to remove the carbon-containing segment 19. The etch products given off by the carbon-containing sacrificial layer 17 escape through the second vents 32.2. Communication is thus ensured between the space 1.1 in which the thermal detectors 20 are located and the space 1.2 in which the getter segment 13 is located, this communication being ensured not by the absence of physical link between the internal wall 31.3 and the top wall 31.1, but by the absence of a physical link between the internal wall 31.3 and the readout substrate 10. This absence of physical link may or may not be continuous along the internal wall 31.3.

With reference to FIG. 3E, the sealing layer 33 is then deposited on the thin encapsulation layer 31 so as to seal, i.e. plug, the various release vents 32.1, 32.2. Furthermore, the antireflection layer 34 is deposited. The chemisorption of the getter segment 13 is then activated via a heat treatment.

Particular embodiments have just been described. Various modifications and variants will be obvious to anyone skilled in the art.

Thus, generally, the step of producing the getter segment 13 may be carried out before or after the step of producing the thermal detectors 20, as illustrated by the two embodiments. Moreover, the getter segment 13 may extend laterally in the XY-plane so that the peripheral wall 31.2 rests in contact with the latter, thus improving the adhesion of the encapsulation structure 30 to the readout substrate 10.

The invention claimed is:

1. A process for fabricating a device for detecting electromagnetic radiation, comprising:
producing, on a substrate, at least one thermal detector, which is covered by at least one mineral sacrificial layer made of a mineral material able to be removed by a first chemical etch;
producing a through-aperture that extends through the mineral sacrificial layer and that opens onto the substrate;
producing a getter segment made of a metal that has a gettering effect, the getter segment being placed on and in contact with the substrate and at a distance from the thermal detector in a plane parallel to the substrate, the getter segment being located in the through-aperture, at a distance from a lateral border that is defined by the mineral sacrificial layer and that bounds the through-aperture in the plane parallel to the substrate;
producing a carbon-containing sacrificial layer made of a carbon-containing material that is inert to the first chemical etch and that is able to be removed by a second chemical etch, so as to cover the getter segment and to surround it in the plane parallel to the substrate, and to completely fill the through-aperture;
producing a thin encapsulation layer comprising: a top portion that rests on the mineral sacrificial layer and on the carbon-containing sacrificial layer; and a peripheral portion that extends through the mineral sacrificial layer and that surrounds the thermal detector and the getter segment;
removing the mineral sacrificial layer via the first chemical etch; and
removing the carbon-containing sacrificial layer via the second chemical etch.

2. The process as claimed in claim 1, wherein the getter segment is placed between the thermal detector and the peripheral portion of the thin encapsulation layer.

3. The process as claimed in claim 1, wherein the peripheral portion comprises an internal surface, which is oriented toward the thermal detector, and which makes contact with the carbon-containing sacrificial layer.

4. The process as claimed in claim 1, wherein the mineral sacrificial layer and the carbon-containing sacrificial layer have, opposite the substrate, top faces that are coplanar.

5. The process as claimed in claim 1, wherein the mineral material comprises at least silicon oxide or silicon nitride, and the first chemical etch is an etch in hydrofluoric-acid vapor.

6. The process as claimed in claim 1, wherein the carbon-containing material is chosen from amorphous carbon and polyimide, and the second chemical etch is a dry oxygen-plasma etch.

7. The process as claimed in claim 1, wherein the metal that has a gettering effect is chosen from titanium, zirconium, vanadium, chromium, cobalt, iron, manganese, palladium, barium, and/or aluminum, and an alloy of these metals.

8. The process as claimed in claim 1, comprising producing at least one first release vent and at least one second release vent through the top portion of the thin encapsulation layer, the first release vent opening onto the mineral sacrificial layer, and the second release vent opening onto the carbon-containing sacrificial layer.

9. The process as claimed in claim 8, wherein the first and second release vents are produced before the first chemical etch, the carbon-containing sacrificial layer under the top portion of the thin encapsulation layer making contact with the mineral sacrificial layer.

10. The process as claimed in claim 8, wherein the thin encapsulation layer further comprises an internal portion that extends from the top portion of the thin encapsulation layer toward the substrate, and that is placed between the mineral sacrificial layer and the carbon-containing sacrificial layer, so that the carbon-containing sacrificial layer under the top portion of the thin encapsulation layer makes contact with the top portion of the thin encapsulation layer, peripheral portion and internal portion of the thin encapsulation layer.

11. The process as claimed in claim 10, wherein the step of producing the second release vents comprises, in addition to forming at least one second release vent that opens onto the carbon-containing sacrificial layer, forming at least one vent located plumb with the internal portion and that breaks a physical link, at least locally, between the internal portion and the top portion, thus ensuring, after the second chemical etch, communication between a first space in which the thermal detector is located and a second space in which the getter segment is located.

12. The process as claimed in claim 10, wherein the internal portion rests in contact with a carbon-containing segment placed in contact with the substrate and made of a carbon-containing material that is inert to the first chemical etch and that is able to be removed by the second chemical etch, so that the second chemical etch removes the carbon-containing sacrificial layer and releases the getter segment, and removes the carbon-containing segment and ensures communication between a first space in which the thermal detector is located and a second space in which the getter segment is located.

13. The process as claimed in claim 1, wherein a plurality of thermal detectors are produced simultaneously, each comprising a membrane configured to absorb the electromagnetic radiation to be detected, said membrane being suspended above the substrate by anchoring pillars and being thermally insulated from the substrate by holding arms.

14. The process as claimed in claim 1, wherein the top portion of the thin encapsulation layer rests on and in contact with the mineral sacrificial layer, and rests on and in contact of the carbon-containing sacrificial layer.

* * * * *